United States Patent
Ledentsov et al.

(10) Patent No.: US 10,516,251 B2
(45) Date of Patent: Dec. 24, 2019

(54) RELIABLE HIGH-SPEED OXIDE-CONFINED VERTICAL-CAVITY SURFACE-EMITTING LASER

(71) Applicant: VI Systems GmbH, Berlin (DE)

(72) Inventors: Nikolay Ledentsov, Berlin (DE); Vitaly Shchukin, Berlin (DE)

(73) Assignee: VI Systems GmbH, Berlin (DE)

( * ) Notice: Subject to any disclaimer, the term of this patent is extended or adjusted under 35 U.S.C. 154(b) by 0 days.

(21) Appl. No.: 15/632,133

(22) Filed: Jun. 23, 2017

(65) Prior Publication Data

US 2017/0373470 A1 Dec. 28, 2017

Related U.S. Application Data

(60) Provisional application No. 62/355,689, filed on Jun. 28, 2016.

(51) Int. Cl.
H01S 5/183 (2006.01)
H01S 5/20 (2006.01)

(52) U.S. Cl.
CPC ...... *H01S 5/18369* (2013.01); *H01S 5/18313* (2013.01); *H01S 5/205* (2013.01)

(58) Field of Classification Search
CPC ... H01S 5/18311–18313; H01S 5/18361–1838
See application file for complete search history.

(56) References Cited

U.S. PATENT DOCUMENTS 6,317,446 B1 * 11/2001 Wipiejewski ....... H01S 5/18313
  372/46.01
7,339,965 B2 * 3/2008 Ledentsov ............ B82Y 20/00
  372/29.022
(Continued)

FOREIGN PATENT DOCUMENTS

EP  3179581 A1 * 6/2017 ......... H01S 5/18313
JP  2012019041 A * 1/2012 ......... H01S 5/18311
(Continued)

OTHER PUBLICATIONS

Thibeault et al., "Reduced Optical Scattering Loss in Vertical-Cavity Lasers Using a Thin (300 Å) Oxide Aperture", May 1996, IEEE Photonics Tech. Letters, vol. 8, No. 5, 593-595 (Year: 1996).*
(Continued)

*Primary Examiner* — Joshua King
(74) *Attorney, Agent, or Firm* — Gordon Rees Scully Mansukhani, LLP

(57) ABSTRACT

An oxide-confined vertical cavity surface emitting laser including a distributed Bragg reflector (DBR) wherein the layers of the (DBR) includes a multi-section layer consisting of a first section having a moderately high aluminum composition, an second section which is an insertion having a low aluminum composition, and a third section which is an oxide-confined aperture formed by partial oxidation of a layer having a high aluminum composition (95% and above). A difference in aluminum composition between a high value in the aperture layer and a moderately high value in the first section prevents non-desirable oxidation of the first section from the mesa side while the aperture layer is being oxidized. A low aluminum composition in the second section prevents non-desirable oxidation in the vertical direction of the layer adjacent to the targeted aperture layer.

16 Claims, 10 Drawing Sheets

(56) References Cited

U.S. PATENT DOCUMENTS

| | | | | |
|---|---|---|---|---|
| 2002/0150135 | A1* | 10/2002 | Naone | B82Y 20/00 |
| | | | | 372/45.011 |
| 2003/0219921 | A1* | 11/2003 | Biard | H01S 5/18313 |
| | | | | 438/38 |
| 2004/0213310 | A1* | 10/2004 | Otoma | B82Y 20/00 |
| | | | | 372/45.013 |
| 2005/0100068 | A1* | 5/2005 | Jikutani | B82Y 20/00 |
| | | | | 372/46.01 |
| 2008/0187015 | A1* | 8/2008 | Yoshikawa | B82Y 20/00 |
| | | | | 372/45.01 |
| 2009/0080489 | A1* | 3/2009 | Uchida | B41J 2/435 |
| | | | | 372/50.124 |
| 2009/0129417 | A1* | 5/2009 | Maeda | H01S 5/18355 |
| | | | | 372/44.01 |
| 2009/0285252 | A1* | 11/2009 | Ishii | H01S 5/18355 |
| | | | | 372/44.011 |
| 2010/0189467 | A1* | 7/2010 | Sato | B41J 2/45 |
| | | | | 372/46.013 |
| 2010/0208760 | A1* | 8/2010 | Yoshikawa | H01S 5/1833 |
| | | | | 372/44.01 |
| 2010/0226402 | A1* | 9/2010 | Maeda | H01S 5/18313 |
| | | | | 372/45.01 |
| 2012/0008659 | A1* | 1/2012 | Kawakita | H01S 5/18311 |
| | | | | 372/45.01 |
| 2014/0341246 | A1* | 11/2014 | Watanabe | H01S 5/18358 |
| | | | | 372/45.012 |
| 2016/0064900 | A1* | 3/2016 | Takeda | H01S 5/18311 |
| | | | | 438/29 |

FOREIGN PATENT DOCUMENTS

| | | | | |
|---|---|---|---|---|
| JP | 2015008271 A | * | 1/2015 | H01S 5/0421 |
| WO | WO-2016198282 A1 | * | 12/2016 | H01S 5/18305 |

OTHER PUBLICATIONS

Kent D. Choquette, et al.; "Advances in Selective Wet Oxidation of AlGaAs Alloys"; IEEE Journal of Selected Topics in Quantum Electronics; vol. 3; No. 3, Jun. 1997; pp. 916-926.

Rainer Michalzik; "VCSELs Fundamentals, Technology and Applications of Vertical-Cavity Surface-Emitting Lasers"; Springer Series in Optical Sciences; vol. 166; 16 pages.

Yu Higuchi et al.; "830-nm Polarization Controlled Lasing of InGaAs Quantum Wire Vertical-Cavity Surface-Emitting Lasers Grown on (775)B GaAs Substrates by Molecular Beam Epitaxy"; IOPSCIENCE;Japanese Journal of Applied Physics; vol. 46; No. 7; The Japan Society of Applied Physics (2007); pp. L138-L141.

F. Lissillour et al.; "InAs—InGaAs quantum dot VCSELs on GaAs substrates emitting at 1.3 um"; Electronic Letters (IEE) Online No. 20001012; Aug. 3, 2000; vol. 36; No. 16; pp. 1384-1385.

Anders Larsson et al.; "High Speed VSCELs and VCSEL Arrays for Single and Multicore Fiber Interconnects"; Vertical-Cavity Surface-Emitting Lasers XIX; Proc. of SPIE vol. 9381 93810D-1-93810D-11.

Alex Mutig et al.; "Progress on High-Speed 980 nm VCSELs for Short-Reach Optical Interconnects"; Hindawi Publishing Corporation; Advances in Optical Technologies; vol. 2011; Article ID 290508; 15 pages.

* cited by examiner

RELIABLE HIGH-SPEED OXIDE-CONFINED VERTICAL-CAVITY SURFACE-EMITTING LASER

REFERENCE TO RELATED APPLICATIONS

This application claims an invention which was disclosed in Provisional Application No. 62/355,689, filed Jun. 28, 2016, entitled "RELIABLE HIGH-SPEED OXIDE-CONFINED VERTICAL-CAVITY SURFACE-EMITTING LASER". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of optoelectronic devices. More particularly, the invention pertains to light emitting devices.

Description of Related Art

Vertical Cavity Surface Emitting Lasers (VCSELs) have a broad area of applications covering sensing, gesture recognition, illumination and display applications. VCSELs are key components for optical interconnects and are widely applied in high performance computers and data centers. The development of short reach high-speed data transmission systems according to the Roadmap of the Institute of Electrical and Electronics Engineers (IEEE) is accompanied by a doubling of the bit rate via core networking approximately every 18 months, having reached in the year 2017 50 Gb/s per channel. Thus, there is a continuous demand to further increase the modulation bandwidth of the devices.

A typical industrial VCSEL is processed from an epitaxially grown semiconductor wafer. The epitaxial structure contains an optical cavity, preferably undoped, into which the active medium is placed, the cavity being sandwiched between a bottom distributed Bragg reflector (DBR) and a top DBR, each DBR being composed of alternating layers having a high and a low refractive index. The bottom DBR is preferably n-doped, and the top DBR is preferably p-doped.

In order to define the path for the electric current, oxide-confined aperture is employed. Since the oxidation rate of the alloy material Ga(1-x)Al(x)As depends drastically on the gallium content, reaching the maximum value for the pure binary AlAs and decreasing rapidly upon adding gallium, the selective oxidation is possible, where one or several layers of AlAs or Ga(1-x)Al(x)As with a high Al content (preferably above 95%) is oxidized forming amorphous dielectric material AlO(y) or Ga(1-x)Al(x)O(y), whereas the rest of the layers remain hardly affected by the oxidation. The oxide-confined aperture defines the path of the electric current controlling the generation of light in the active medium just beneath the aperture. This helps preventing generation of light beneath the contact pads and metal contacts and thus prevents the absorption of light in the contacts. A further effect of the oxide-confined aperture is a reduction of the parasitic capacitance of the VCSEL whereas a low capacitance is a mandatory requirement allowing a high-speed operation of the device.

FIGS. 1A and 1B illustrate a prior art oxide-confined VCSEL. FIG. 1A shows the refractive index profile, and FIG. 1B depicts the spatial profile of the optical field of the longitudinal optical mode. Under the term "optical field" the electric field of the optical wave for the TE optical mode or the magnetic field of the optical wave for the TM optical mode is understood.

FIGS. 2A through 2C illustrate the structure and the optical field of the prior art oxide-confined VCSEL at a larger magnification. The epitaxial structure of the VCSEL is formed of layers of Ga(1-x)Al(x)As with variable alloy composition x. The active region is formed of multiple quantum wells (QWs). For definiteness, the VCSEL targeted for lasing in the spectral range 850 nm is shown. The quantum wells are preferably compressively-strained Ga(1-z)In(z)As quantum wells. Five QWs are shown in FIGS. 2A through 2C. FIG. 2A displays the energy band gap profile. The QWs are the layers with the narrowest band gap in the structure. For the Ga(1-x)Al(x)As, the larger the aluminum content the broader the band gap. The refractive index of Ga(1-x)Al(x)As behaves in the opposite way, the larger the aluminum content, the lower the refractive index, the profile of which is given in FIG. 2B.

The VCSEL of FIGS. 2A through 2C contains a $\lambda/2$ optical cavity (203), in which the active medium (205) is placed. Adjacent to the active medium (205) from the top side is the first layer (210) of the top DBR, namely the first layer with a broad band gap. This is the layer with a high aluminum content and, at the same time, with a low refractive index.

The layer (220) is the second layer of the top DBR with a broad band gap, with a high aluminum content, and with a low refractive index. The oxide-confined aperture (225) is placed in the second layer with a broad band gap (220).

Positioning of the oxide-confined aperture in the VCSEL structure is a result of a trade-off of different controversial requirements. On the one hand, to reduce the capacitance of the device and to promote high-speed operation, the aperture should be placed as close as possible to the active medium. Otherwise the current spreading in the doped layers between the aperture and the active medium will increase the effective area of the p-n junction and thus the capacitance will be increased, while the resistance will stay high being mostly defined by the size of the oxide aperture. Furthermore, for high speed operation a maximum field intensity is demanded in the active region making the VCSEL cavity very short and reducing thus the thickness between the active region and first layer with a high AlAs composition. On the other hand, positioning of the oxide-confined aperture close to the active medium may cause reliability issues. Oxidation proceeds via substituting of arsenic atoms by oxygen atoms, the arsenic atoms come out of the layer, they can diffuse to the surface of the mesa and evaporate but can also diffuse into the nearby regions and form point defects and clusters of point defects in the layers suited for current injection into the active region. During the operation of the device, the carriers can thermally escape from the active medium to the adjacent injecting layers with oxidation-induced defects and defect clusters caused by the oxide aperture. Consequently, non-radiative recombination can occur at the defects. Once non-radiative recombination occurs at the oxidation-induced defects, these defects can grow in size, form dislocations and result in the degradation of the device. Furthermore, injection of electrons into the thin area with the active media typically results in part of the electrons directly passing the electric field region further enhancing the probability of non-radiative recombination in the defect-rich region close to the oxidized material. Furthermore, the layer configured to form an oxide-confined aperture layer having a high aluminum composition (preferably >95%), is typically attached to the layer of DBR with a moderately high aluminum composition (e. g., 80%-90%). Upon oxidation of the aperture layer, this adjacent layer undergoes oxidation too, resulting in either tapering of the oxide layer or just in increase in thickness of the oxide layer increasing stress and hindering proper control over the performance of the device. Thus, it becomes hardly possible to control scattering loss, leakage, transverse mode selectivity related to the positioning of the oxide-confined aperture with respect to the nodes of the longitudinal optical field (B. Demeulenaere, P. Bienstman, B. Dhoedt and R. G. Baets, "Detailed study of AlAs-oxidized apertures in VCSEL cavities for optimized modal performance", in: IEEE Journal of Quantum Electronics, vol. 35, no. 3, pp. 358-367, March 1999. doi: 10.1109/3.748841, whereas the content of the publication in its entirety is hereby incorporated herein by reference). Many approaches have been proposed to overcome this effect. In one approach the aperture layer is shifted to the second DBR period and the nonequilibrium carriers become separated from the oxide-confined aperture by a thick aluminum-poor layer (A. N. Al-Omari and K. L. Lear, "Polyimide-planarized vertical-cavity surface-emitting lasers with 17.0-GHz bandwidth", in IEEE Photonics Technology Letters, vol. 16, no. 4, pp. 969-971, April 2004. doi: 10.1109/LPT.2004.824622, whereas the content of the publication in its entirety is hereby incorporated herein by reference). However, such an approach does not solve the problem of the tapering of the oxide layers and the related stress as well as does not prevent an unpredictable modification of the optical scattering loss.

Similarly, placing of barrier structures to prevent escape of nonequilibrium carriers from the active region applied in VCSELs (J. A. Lott and K. J. Malloy, "Orange vertical cavity surface emitting lasers", in CLEO/Pacific Rim '95, Pacific Rim Conference on Lasers and Electro-Optics (OSA, 1995), pp. 258-259, whereas the content of the publication in its entirety is hereby incorporated herein by reference) does not solve such a problem as the tapering effects in the aperture region can not be prevented.

Placing an aperture layer directly into a layer with a low aluminum composition, while this layer is located close to the active region, does not solve the problem of nonequilibrium carrier recombination at the oxide aperture. Furthermore simultaneous engineering of the longitudinal optical modes for high speed operation and the realization of the selectivity of the transverse optical modes by design optimization (V. Shchukin, N. N. Ledentsov, J. Kropp, G. Steinle, N. Ledentsov, Jr., S. Burger, F. Schmidt, "Single-Mode Vertical Cavity Surface Emitting Laser via Oxide-Aperture-Engineering of Leakage of High-Order Transverse Modes", IEEE Journal of Quantum Electronics, vol. 50, no. 12, pp. 990-995 (2014), whereas the content of the publication in its entirety is hereby incorporated herein by reference) becomes hardly possible in such approach as such an aperture layer becomes not a part of the multilayer Bragg reflector sequence.

Thus, there exists a need in an approach to realize an oxide-confined vertical-cavity surface-emitting laser such that the oxide-confined aperture is located close to the active medium and the device is at the same time protected against related degradation processes on the one hand, and against poorly controlled vertical oxidation processes, on the other hand.

SUMMARY OF THE INVENTION

An oxide-confined vertical cavity surface emitting laser is disclosed, wherein at least one of the layers of a distributed Bragg reflector (DBR) is a multi-section layer consisting of a first section having a high aluminum composition, which, upon oxidation, forms an oxide-confined aperture, a second section which is an insertion having a low aluminum composition, and a third section with a moderately high aluminum composition. For a DBR formed of $Ga(1-x)Al(x)As$ alloy, a high aluminum composition applied in the layers targeted to form oxide-confined aperture is preferably above 90%, a moderately high aluminum composition in the third section is typically between 80% and 90%, and a low composition in the insertion is typically below 20%. A difference in aluminum composition between a high value in the aperture layer and a moderately high value in the first section suppresses non-desirable oxidation of the third section from the mesa side while the aperture layer is being oxidized. A low aluminum composition in the second section suppresses non-desirable oxidation in the vertical direction of the layer adjacent to the targeted aperture layer. This allows obtaining the oxide confined apertures having a well defined and predictable thicknesses avoiding tapering, accumulation of stresses and generation of stress-induced structural defects. The thickness of the insertion having a low aluminum composition does not exceed one eighth of the wavelength in the semiconductor material thus allowing the DBR layer acting as a conventional $\lambda/4$ DBR layer attenuating the optical field away from the optical cavity.

Once the oxide-confined aperture is positioned at a distance shorter than a half wavelength in the material from the active medium, the insertion having a low aluminum composition has an additional functionality. The minority carriers that can thermally escape from the active medium to the broad-band gap emitter drift away from the active medium, are trapped by the narrow band gap insertion, thermalize and recombine radiatively and non-radiatively in the narrow band gap insertion being not able to transfer the energy towards the oxidation-induced defects prohibiting their growth. Thus the minority carriers are subjected to an additional filter reducing their probability to recombine at the defect-rich region at the oxide confined aperture. No significant recombination occurs in the vicinity of oxidation-induced defects, and the device remains reliable against degradation processes. Thus, a reliable VCSEL with the oxide-confined aperture positioned at a distance less than half wavelength from the active medium is possible. Several narrow gap insertions can also be applied. The region with the insertions can be heavily p-doped to ensure good conductivity and the deepest potential wells for the trapped electrons.

DETAILED DESCRIPTION OF THE INVENTION

Figure 3A:
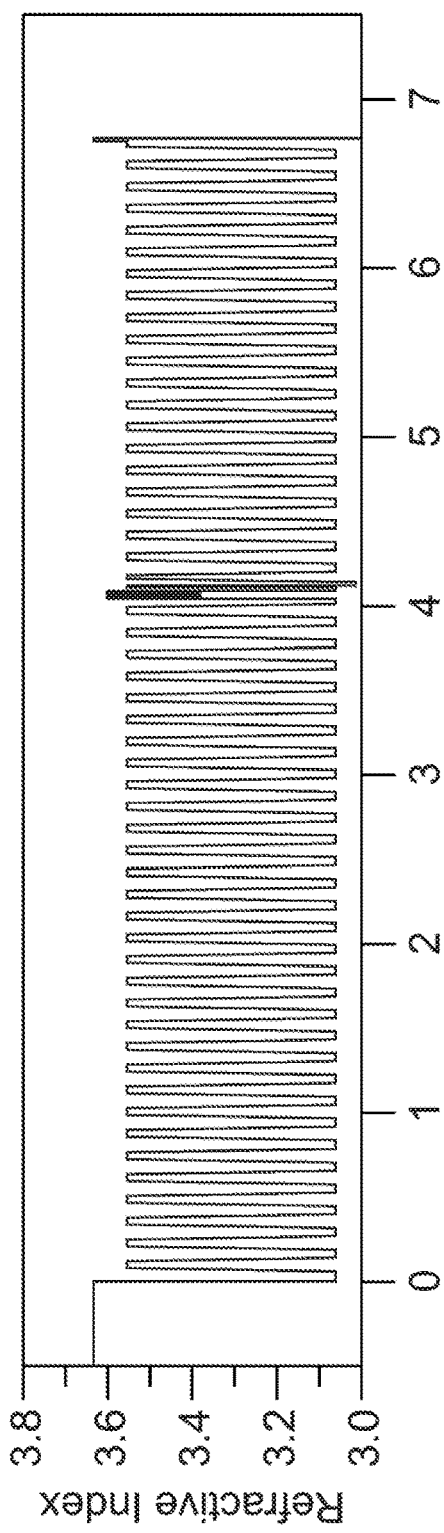
FIG. 3A. Vertical refractive index profile of a vertical-cavity surface emitting laser (VCSEL) according to an embodiment of the present invention.
Figure 3B:
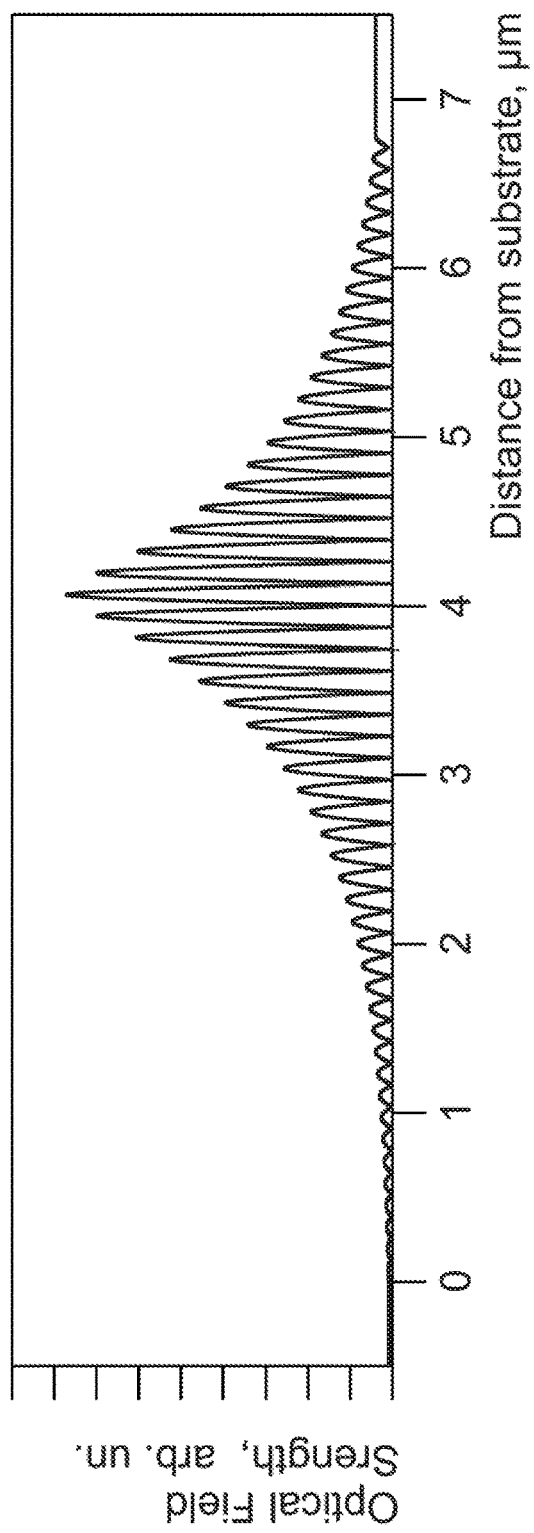
FIG. 3B. Optical field strength profile of the longitudinal optical mode in the vertical-cavity surface emitting laser (VCSEL) according to the embodiment of the present invention of FIG. 3A.

FIG. 3A illustrates the vertical refractive index profile of a VCSEL according to an embodiment of the present invention. FIG. 3B shows the optical field strength profile of the longitudinal optical mode of the device of FIG. 3A. In particular, the absolute value of the electric field is plotted.

Figure 4A:
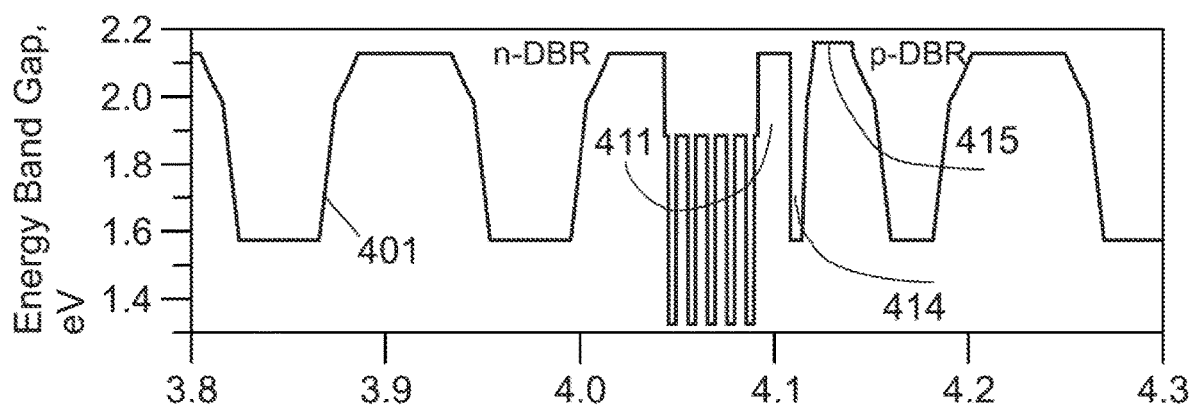
FIG. 4A. Energy band gap profile in the vertical-cavity surface emitting laser (VCSEL) of an embodiment of the present invention of FIG. 3A in the vicinity of the active medium.
Figure 4B:
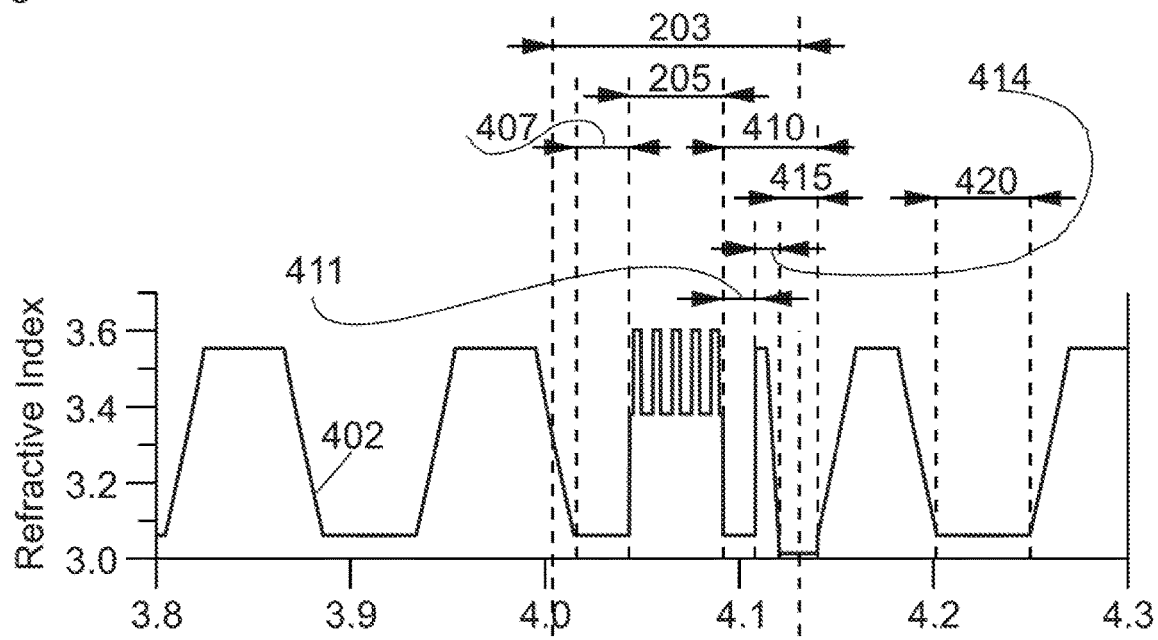
FIG. 4B. Vertical refractive index profile of the vertical-cavity surface emitting laser (VCSEL) of the embodiment of the present invention of FIG. 3A in the vicinity of the active medium, at a larger magnification.
Figure 4C:
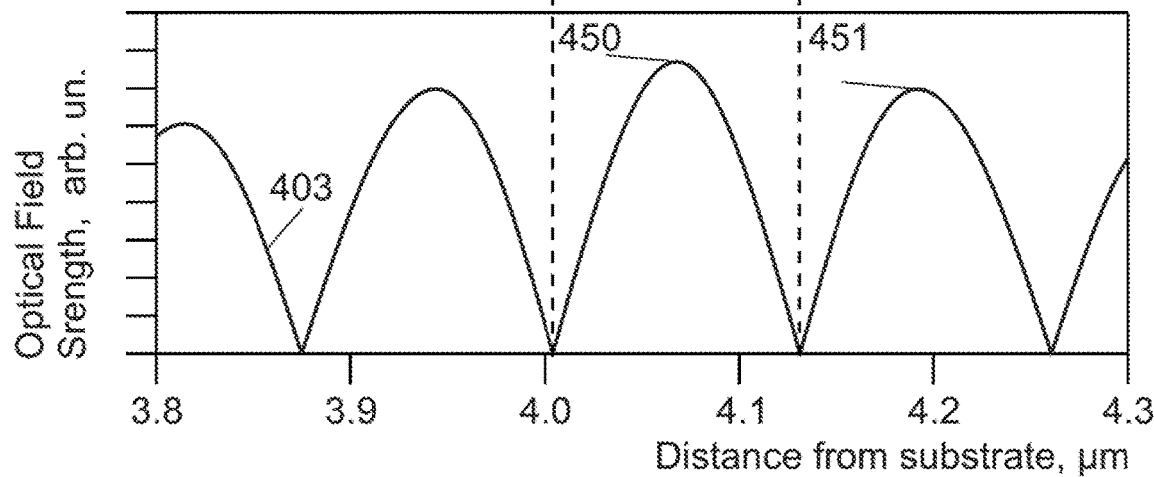
FIG. 4C. Optical field strength profile of the longitudinal optical mode in vertical-cavity surface emitting laser (VCSEL) of the embodiment of the present invention of FIG. 3A in the vicinity of the active medium, at a larger magnification.

FIGS. 4A through 4C illustrate the device of FIG. 3a in the vicinity of the active medium at a larger magnification. FIG. 4A shows the vertical profile of the energy band gap (401) in the structure. FIG. 4B depicts the vertical profile of the refractive index (402). FIG. 4C displays the vertical profile of the optical field strength of the longitudinal mode. The active medium (205) is sandwiched between an n-broad band gap emitter (407) (which is a broad band gap n-cladding layer) and a p-broad band gap emitter (411) (which is a broad band gap p-cladding layer). The oxide confined aperture (415) is placed in the first (closest to the active medium) broad band gap layer (410) of the top DBR. This first layer (closest to the active medium) broad band gap layer (410) contains a broad band gap emitter (411), a narrow band gap insertion (414), and a broad band gap oxide-confined aperture (415).

No oxide-confined aperture is placed in the second broad band gap layer (420).

The narrow band gap insertion (414) is the key element of the present invention. The carriers escaping thermally from the active medium (205) hop into the broad band gap emitter (411) where they are minority carriers (e. g., electrons in the p-doped material). These minority carriers drift due to an applied forward bias away from the active medium and enter the narrow band gap insertion (414). The carriers thermalize in the narrow band gap insertion (414) and undergo radiative and non-radiative recombination. Thus, hardly any minority carrier reach the oxide confined aperture (414) and recombine in the vicinity of the oxidation-induced defects.

In another embodiment of the present invention, a second oxide-confined aperture is placed in the second broad band gap layer (420).

Figure 8:
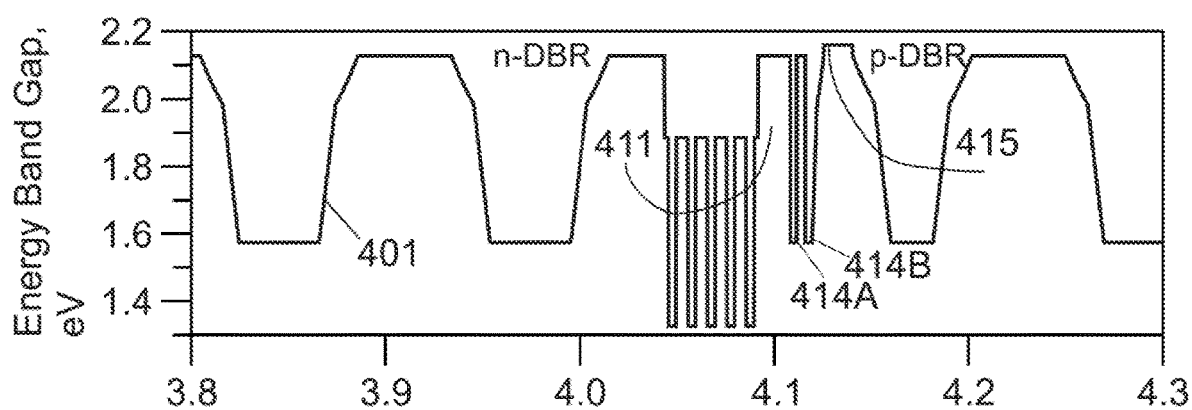
FIG. 8. Energy band gap profile in the vertical-cavity surface emitting laser (VCSEL) of an embodiment of the present invention in the vicinity of the active medium, containing multiple narrow band gap insertions.

In yet another embodiment of the present invention, several narrow band gap insertions (414A), (414B) can be inserted into the broad band gap layer (410), as shown in FIG. 8. Several insertions can be important, depending on the materials used, if the insertions are lattice-mismatched to the substrate, and it is necessary that the thickness of each insertion does not to exceed the critical thickness, to avoid the formation of dislocations.

A one skilled in the art will appreciate that, in order to have every period of the DBR to act as a DBR period attenuating the optical field strength in the longitudinal VCSEL mode away from the cavity, the thickness of the narrow band gap insertion (414) must not be too large. Preferably, the thickness of the narrow band gap insertion should not exceed one eighth of the wavelength of the emitted light in the semiconductor material. For an 850 nm VCSEL based on GaAlAs materials, the thickness of the narrow band gap insertion should not exceed 33 nm.

Thus, in the embodiment of FIGS. 4A through 4C, the broad band gap layer (410), composed of three sections, namely, the aperture layer (415), the narrow band gap insertion (414), and the broad band gap emitter (411), acts as an effective λ/4 DBR layer, ensuring attenuation of the longitudinal optical field from the maximum value of the optical field strength (450) in the cavity to the next local maximum of the optical field strength (451) in the DBR.

As regards aluminum composition in the narrow band gap insertion (414), it should be emphasized that the aluminum composition should be selected such to suppress oxidation in the vertical direction, i. e. suppress oxidation of the layers neighboring to the aperture layer (415). For this purpose, aluminum composition in the layer (414) should be low. Preferably, aluminum composition in the layer (414) should not exceed 50%. More preferably, aluminum composition in the layer (414) should not exceed 20%.

Once the cavity and the DBRs of the VCSEL structure are formed of Ga(1−x)Al(x)As alloy with alternating aluminum composition x, it is possible to define the preferred values of the aluminum composition in different sections more specifically. In the aperture layer (415) aluminum composition preferably exceeds 95%. Narrow band gap insertion (414) has preferably aluminum composition below 20%. The broad band gap emitter (411) has a moderately high aluminum composition, preferably between 80% and 90%. A difference in aluminum composition between the layers (411) and (415) suppress non-desirable oxidation of the layer (411) from the side of the mesa while the aperture layer (415) is being oxidized. To ensure such effect, the difference in aluminum compositions between the aperture layer (415) and the broad band gap emitter (411) should preferably exceed 5%. A low aluminum composition of the insertion (414) suppresses the oxidation in the vertical direction while the aperture layer (415) is being oxidized. However, to keep the functionality of every DBR layer as a DBR layer resulting in attenuation of the optical field away from the optical cavity, the thickness of the insertion (414) with a low aluminum composition must not be too large. Preferably the thickness of the insertion (414) does not exceed one eighth of the wavelength of the emitted light in the semiconductor material. Then the entire layer (410) formed of three sections, acts effectively as an λ/4 DBR layer.

A one skilled in the art will agree that, in order to reduce the series resistance of the VCSEL structure, layers with graded alloy composition are preferably introduced at the interfaces between neighboring layers. As the thickness of the insertion (414) is limited, there can occur a necessity to use such an insertion without layers of graded alloy composition. To keep a moderate series resistance, a heavy doping is needed in this case. For p-doped layers, the doping level should be preferably at least $1 \times 10^{18}$ cm$^{-3}$.

VCSELs operating in the visible red range of the optical spectrum are preferably grown epitaxially on a GaAs substrate formed of an alloy material In(0.49)Ga(0.51−x)Al(x)P lattice-matched to GaAs. In this case, layers of Ga(1−x)Al(x)As with a high aluminum composition can also be used as aperture layers since they are lattice matched to GaAs substrate. Aluminum composition of the alloy In(0.49)Ga(0.51−x)Al(x)P in the narrow band gap insertion (414) and in the broad band gap emitter (411) are selected such that i) the layers are transparent to the emitted laser light in the visible red spectrum and ii) aluminum composition in the narrow band gap insertion (414) is lower than in the broad band gap emitter (411).

For VCSEL grown on InP substrate (e. g., VCSELs configured to emit laser light in the spectral range 1300 nm or in the spectral range 1550 nm), the cavity and the DBRs are formed of alloy material In(0.52)Ga(0.48−x)Al(x)As lattice-matched to InP. Alloys Ga(1−x)Al(x)As are lattice-mismatched to InP. However, it is possible to grow epitaxially moderately thin layers of In(1−x)Al(x)P with alloy composition 70%-80%, those layers being tensile strained with respect to InP substrate having a lattice mismatch between 1.5% and 2.2%.

Thus, considering all three classes of aluminum-containing semiconductor alloys, it is possible to conclude that the aluminum composition in the aperture layer should be always above 70%, aluminum composition in the narrow band gap insertion should be below 50%, and aluminum composition in the broad band gap emitter should have an intermediate value between the other two.

Figure 5A:
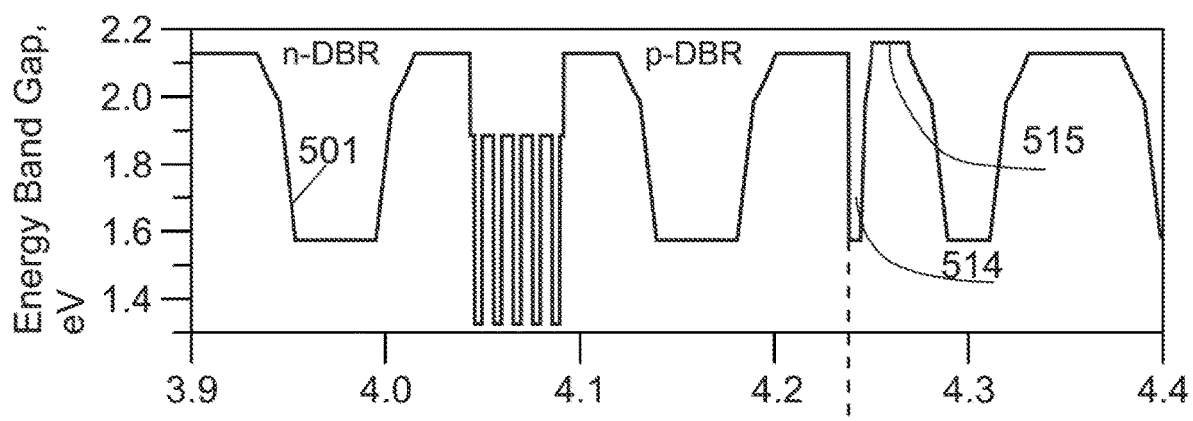
FIG. 5A. Energy band gap profile in the vertical-cavity surface emitting laser (VCSEL) of another embodiment of the present invention in the vicinity of the active medium.
Figure 5B:
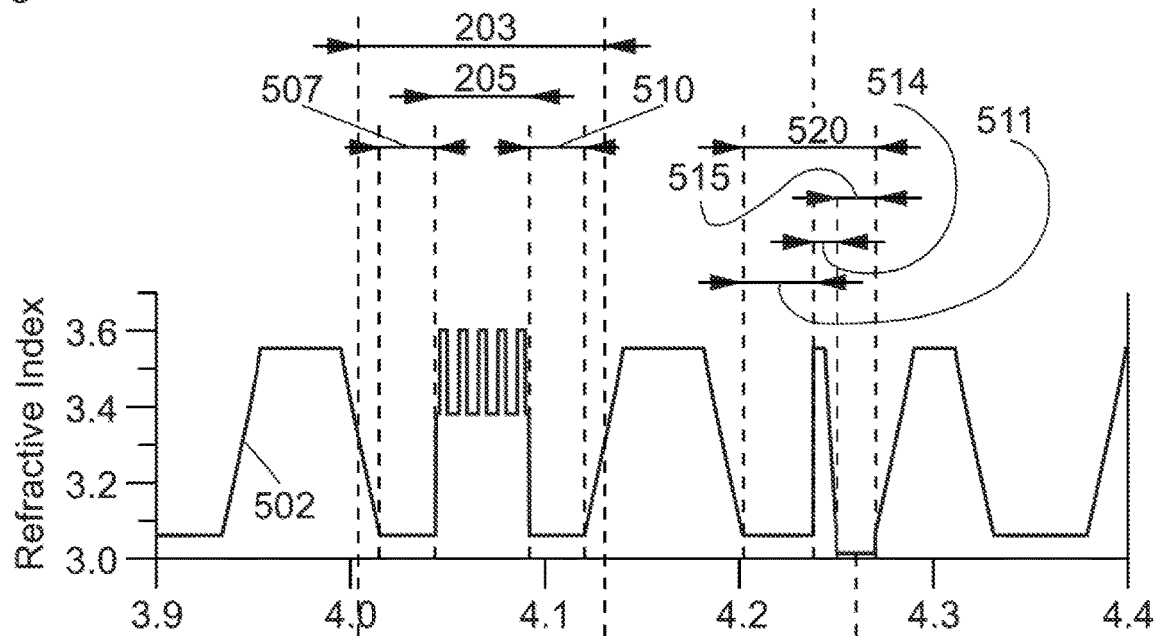
FIG. 5B. Vertical refractive index profile of the vertical-cavity surface emitting laser (VCSEL) of the embodiment of the present invention of FIG. 5A in the vicinity of the active medium.
Figure 5C:
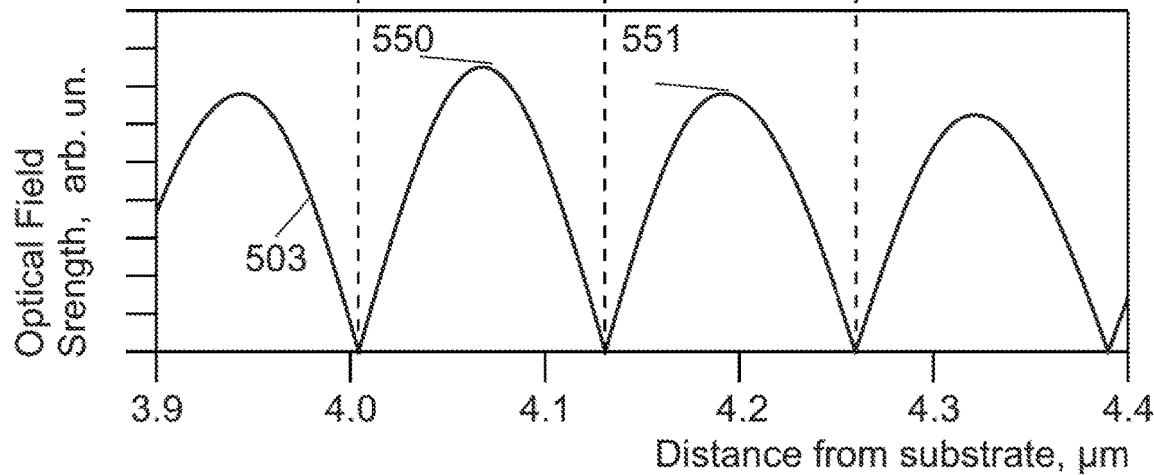
FIG. 5C. Optical field strength profile of the longitudinal optical mode in vertical-cavity surface emitting laser (VCSEL) of the embodiment of the present invention of FIG. 5A in the vicinity of the active medium, at a larger magnification.

In yet another embodiment of the present invention illustrated in FIGS. 5A through 5C, a focus is made on preventing effects of stresses generated by the oxidation process and the presence of an oxide layer (oxide layers) in the semiconductor matrix. The active medium (205) is sandwiched between an n-broad band gap emitter (507) and a p-broad band gap emitter (510). The aperture layer (515) is positioned in the second broad band gap layer (520) on the p-side from the cavity (203). FIG. 5A shows the band gap profile (501) in the vicinity of the active medium. FIG. 5B depicts the refractive index profile (502), and FIG. 5C displays the optical field strength of the longitudinal VCSEL mode (503). The layer (514) having a low aluminum composition is positioned adjacent to the aperture layer (515), and a layer (511) having a moderately high aluminum composition (511) is positioned adjacent to the layer (514) opposite to the aperture layer (515).

As regards aluminum composition in the insertion (514), it should be emphasized that the aluminum composition should be selected such to suppress oxidation in the vertical direction, i. e. suppress oxidation of the layers neighboring to the aperture layer (515). For this purpose, aluminum composition in the layer (514) should be low. Preferably, aluminum composition in the layer (514) should not exceed 50%. More preferably, aluminum composition in the layer (514) should not exceed 20%.

Thus, once the VCSEL is formed of Ga(1−x)Al(x)As materials, the second broad band gap (520) of the top DBR contains the aperture layer (515), with aluminum composition preferably exceeding 95%, a narrow band gap insertion (514) with aluminum composition preferably below 50%, and most preferably below 20%, and a broad band gap layer (511) having a moderately high aluminum composition, preferably between 80% and 90%. A difference in aluminum composition between the layers (511) and (515) suppresses non-desirable oxidation of the layer (511) from the side of the mesa while the aperture layer (515) is being oxidized. A low aluminum composition of the insertion (514) suppresses oxidation in the vertical direction while the aperture layer (515) is being oxidized. However, to keep the functionality of every DBR layer as a DBR layer resulting in attenuation of the optical field away from the optical cavity, the thickness of the insertion (514) with a low aluminum composition must not be too large. Preferably the thickness of the insertion (514) does not exceed one eighth of the wavelength of the emitted light in the semiconductor material.

Thus, in the embodiment of FIGS. 5A through 5C, the broad band gap layer (520), composed of three sections, namely, the aperture layer (515), the narrow band gap insertion (514), and the broad band gap layer (511), acts as an effective λ/4 DBR layer, ensuring attenuation of the longitudinal optical field from the maximum value of the optical field strength (550) in the cavity to the next local maximum of the optical field strength (551) in the DBR.

Figure 9:
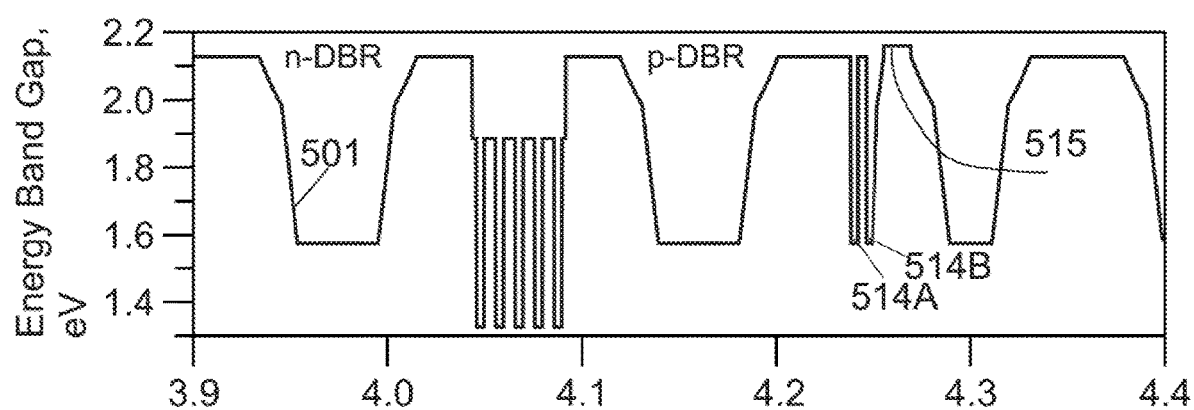
FIG. 9. Energy band gap profile in the vertical-cavity surface emitting laser (VCSEL) of another embodiment of the present invention in the vicinity of the active medium, containing multiple narrow band gap insertions.

In yet another embodiment of the present invention, several narrow band gap insertions (514A), (514B) can be inserted into the broad band gap layer (520) (as shown in FIG. 9). Several insertions can be important, depending on the materials used, if the insertions are lattice-mismatched to the substrate, and it is necessary not to exceed the thickness of each insertion, to avoid the formation of dislocations.

Thus, it is disclosed a VCSEL structure having the following structural features. A DBR formed by alternating layers of a low and moderately high aluminum composition, contains, at least one aperture structural element. The aperture structural element is formed in one of the DBR layers having a moderately high Al composition and contains i) a first section having a high Al composition (415,515), ii) a second section having a low Al composition (414,514), adjacent to the first section, and iii) a third section having a moderately high Al composition (411,511). Here the high Al composition exceeds the moderately high Al composition by at least 5% to suppress non-desirable oxidation of the third section from the side of the mesa. The low Al composition of the second section is employed to suppress non-desirable oxidation of the second section in the vertical direction. The third section is present to ensure that the entire structural element acts effectively as an λ/4 DBR layer leading to attenuation of the optical field away from the resonant cavity. For this purpose the thickness of the second layer (414,514) must not exceed one eighth of the wavelength of the emitted light in the semiconductor material.

FIGS. 6A through 7C refer to the waveguding/antiwaveguding properties of the optical cavity. VCSEL with an antiwaveguding propertires was disclosed in the US Patent "OPTOELECTRONIC DEVICE BASED ON AN ANTI-WAVEGUIDING CAVITY", U.S. Pat. No. 7,339,965, filed Apr. 5, 2005, issued Mar. 4, 2008, invented by the inventors of the present invention, wherein the content of the patent in its entirety is hereby incorporated herein by reference.

Figure 6A:
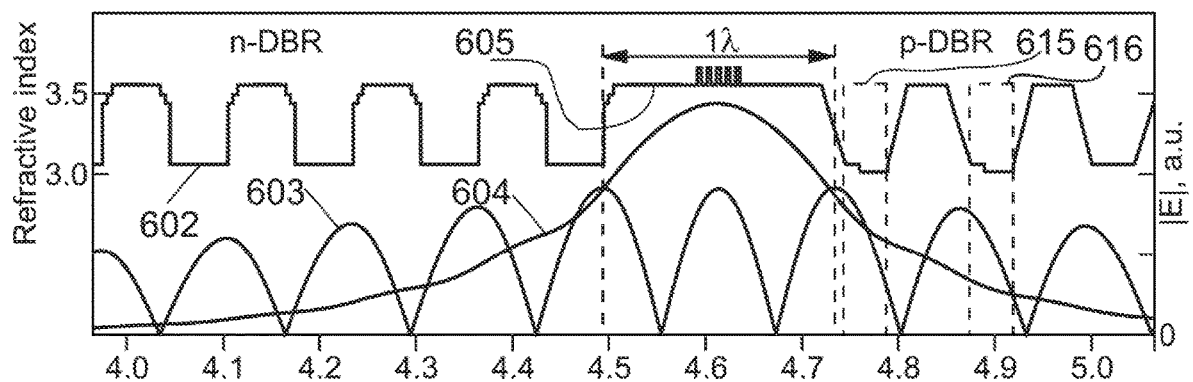
FIG. 6A. Schematics of an 1λ-VCSEL showing, in the vicinity of the active medium, the refractive index profile (602), and the optical field strength profile of both the longitudinal VCSEL mode (603) and the parasitic waveguiding mode (604).
Figure 6B:
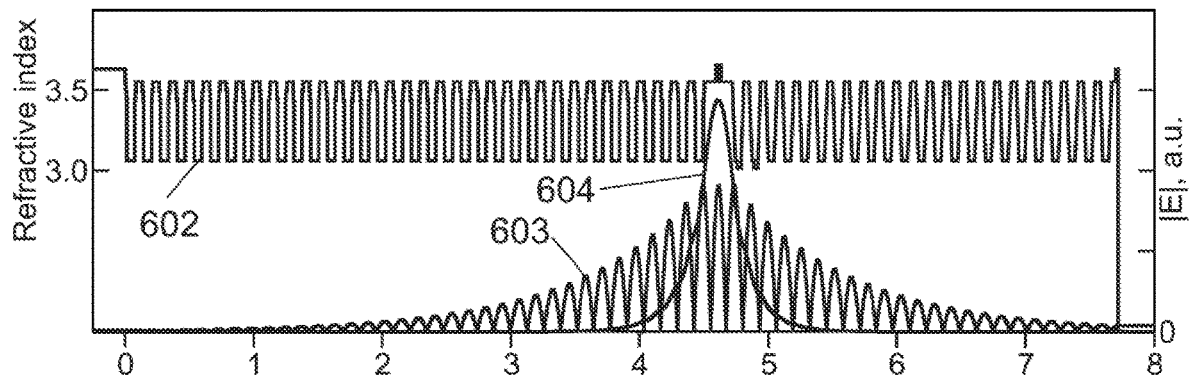
FIG. 6B. Schematics of the 1λ-VCSEL of FIG. 6A showing, in the non-oxidized domain, the vertical profiles of the refractive index (602), and of the optical field strength profile of both the longitudinal VCSEL mode (603) and the parasitic waveguiding mode (604).

Depending on the particular configuration of the optical cavity, the VCSEL can be waveguiding or antiwaveguding. FIG. 6A illustrates schematically the central part of a VCSEL showing the refractive index profile (602) and the optical field strength profile of the longitudinal mode (603). The two periods (615) and (616) of the top DBR are subject to oxidation and formation of oxide-confined apertures. The cavity (605) is a 1λ-cavity having a high refractive index approximately equal to the high refractive index in the DBR layers. The cavity (605) is capable to guide a waveguide mode, i. e. the cavity (605) is an effective waveguide, and the optical field strength profile of the waveguiding mode is shown (604). FIG. 6B shows the entire vertical profiles of the refractive index (602), the longitudinal VCSEL mode (603), and the waveguding mode (604). It should be noted that the intensity of the waveguding mode in the active medium exceeds the intensity of the VCSEL mode rendering this waveguding mode a dangerous parasitic mode that could also hinder the high speed functionality of VCSEL in the mesa, increasing spontaneous emission in undesirable modes.

Figure 6C:
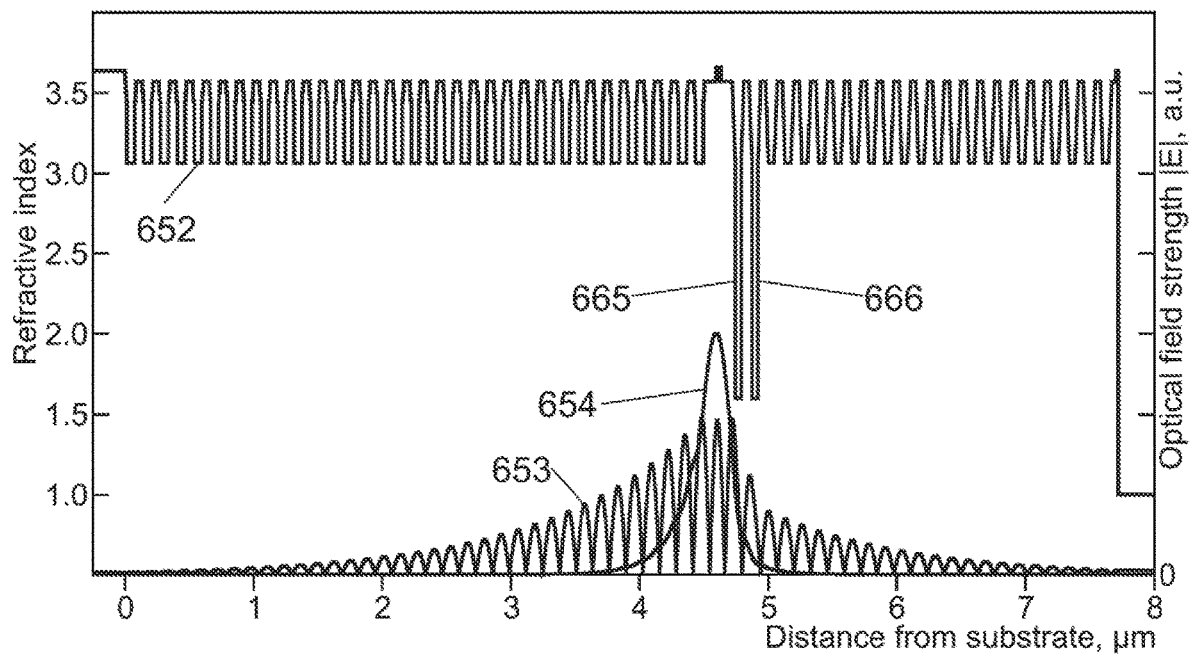
FIG. 6C. Schematics of the 1λ-VCSEL of FIG. 6a showing, in the oxidized domain, the vertical profiles of the refractive index (652), and of the optical field strength profile of both the longitudinal VCSEL mode (653) and the parasitic waveguiding mode (654).

FIG. 6C illustrates the vertical profiles of the refractive index (652), of the longitudinal VCSEL mode (653), and of the waveguding mode (654) in the oxidized domain of the VCSEL. The aperture layers (615) and (616) are partially oxidized forming two oxide layers (665) and (666). Modification in the refractive index profile affects the optical modes. However, due to strong localization properties of a 1λ-cavity, the waveguding mode (654) persists also in the oxidized domain.

Figure 7A:
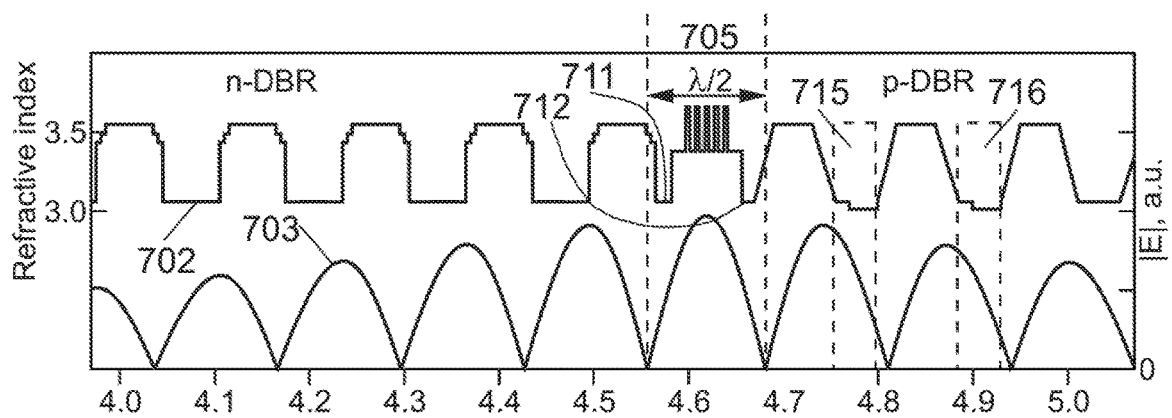
FIG. 7A. Schematics of a 0.5λ-VCSEL showing, in the vicinity of the active medium, the refractive index profile (702), and the optical field strength profile of the longitudinal VCSEL mode (703).
Figure 7B:
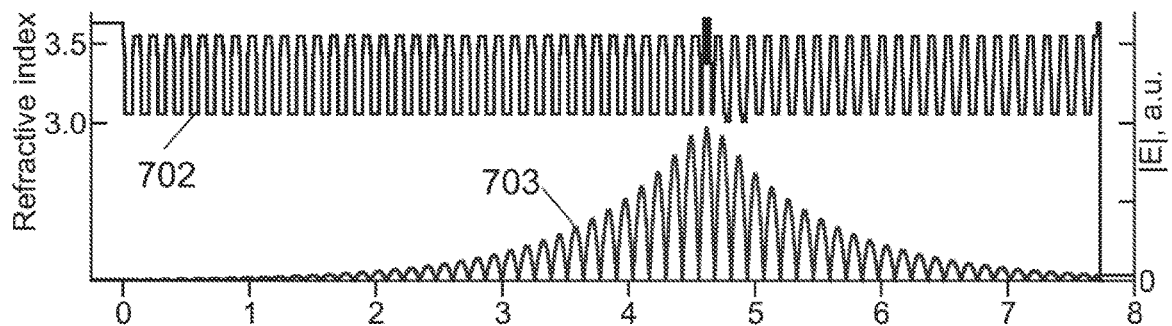
FIG. 7B. Schematics of the 0.5λ-VCSEL showing, in the non-oxidized domain, the vertical profile of the refractive index (702) and the optical field strength in the longitudinal VCSEL mode (703).
Figure 7C:
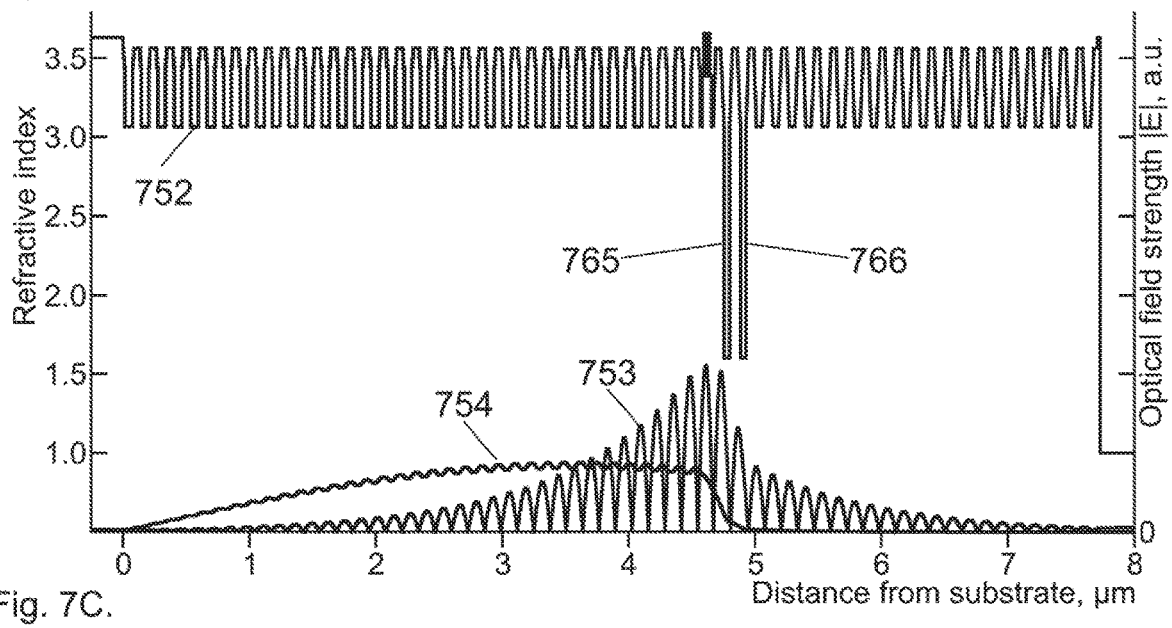
FIG. 7C. Schematics of the 0.5λ-VCSEL showing, in the oxidized domain, the vertical profile of the refractive index (752), of the optical field strength in the longitudinal VCSEL mode (753), and of the optical field strength in the waveguding mode (754) confirming a strong suppression of the waveguiding mode and, thus, the antiwaveguding nature of the 0.5λ-VCSEL.

A completely different situation occurs for a 0.5λ-cavity referred to in FIGS. 7A through 7C. FIG. 7A illustrates the refractive index profile (702) and the optical field strength profile of the longitudinal mode (703) in the central part of the device. The two periods (715) and (716) of the top DBR are subject to oxidation and formation of oxide-confined apertures. The cavity (705) is a 0.5λ-cavity, wherein the active medium is sandwiched between the layers (711) and (712) having a low refractive index, close to the low refractive index of the DBR layers. The average refractive index of the cavity is thus significantly reduced with respect to that of the VCSEL of FIG. 6A. As disclosed in U.S. Pat. No. 7,339,965, the properties of the VCSEL change dramatically once the average refractive index of the cavity becomes lower than the average refractive index of the DBRs. In particular, in the embodiment of FIG. 7A, the former waveguiding mode that existed in the VCSEL structure of FIG. 6B, is now spread across both DBRs.

FIG. 7B shows the refractive index profile (702) and the optical field strength profile (703) of the VCSEL mode in the entire VCSEL structure. A strong difference of the VCSEL with a 0.5λ-cavity from that with a 1λ-cavity manifests itself in the oxidized domain. FIG. 7C displays the refractive index profile (752) in the oxidized domain, where the aperture layers (715) and (716) are oxidized forming two oxide layers (765) and (766). The change of the longitudinal VCSEL mode (753) with respect to the mode (703) is approximately the same as in FIG. 6C. A drastic difference occurs for the waveguding mode. FIG. 7C demonstrates that the oxide layers (765) and (766) pull the waveguding mode (754) out of the active medium. As all figures including FIG. 7C display optical field strength profiles, a difference in intensities is even more pronounced rendering an approximate order-of-magnitude suppression of the intensity of the waveguding mode (754) in the active medium with respect to the intensity of the longitudinal VCSEL mode (753). Thus, if the waveguding mode could exist in the central, non-oxidized part of the VCSEL structure, it is strongly suppressed in the oxidized domain. Therefore such mode does not make a negative impact on the operation of high-speed VCSELs.

It should be emphasized that most of the modern VCSELs are antiwaveguding VCSELs. In particular, both VCSELs disclosed here, in the embodiments of FIGS. 4A and 5A are antiwaveguding. In FIG. 4A, the cavity is a 0.5λ-cavity, in which the active medium is sandwiched between the layers (407) and (411) having low refractive indices. In FIG. 5A, the cavity is also a 0.5λ-cavity, in which the active medium is sandwiched between the layers (507) and (510) having low refractive indices.

Figure 1A:
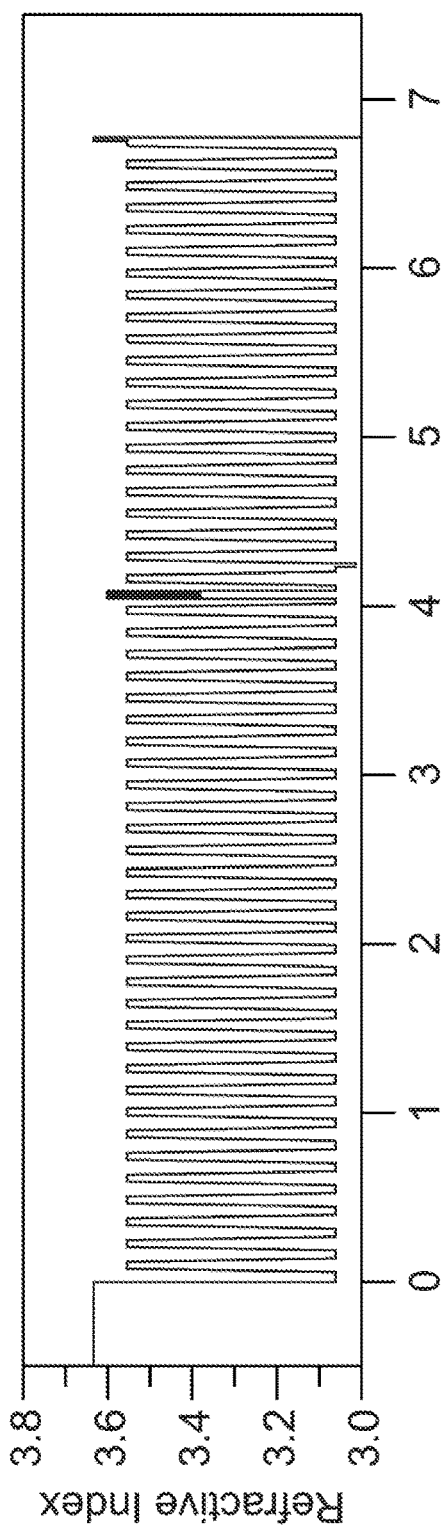
FIG. 1A. Vertical refractive index profile of a prior art vertical-cavity surface emitting laser (VCSEL).
Figure 1B:
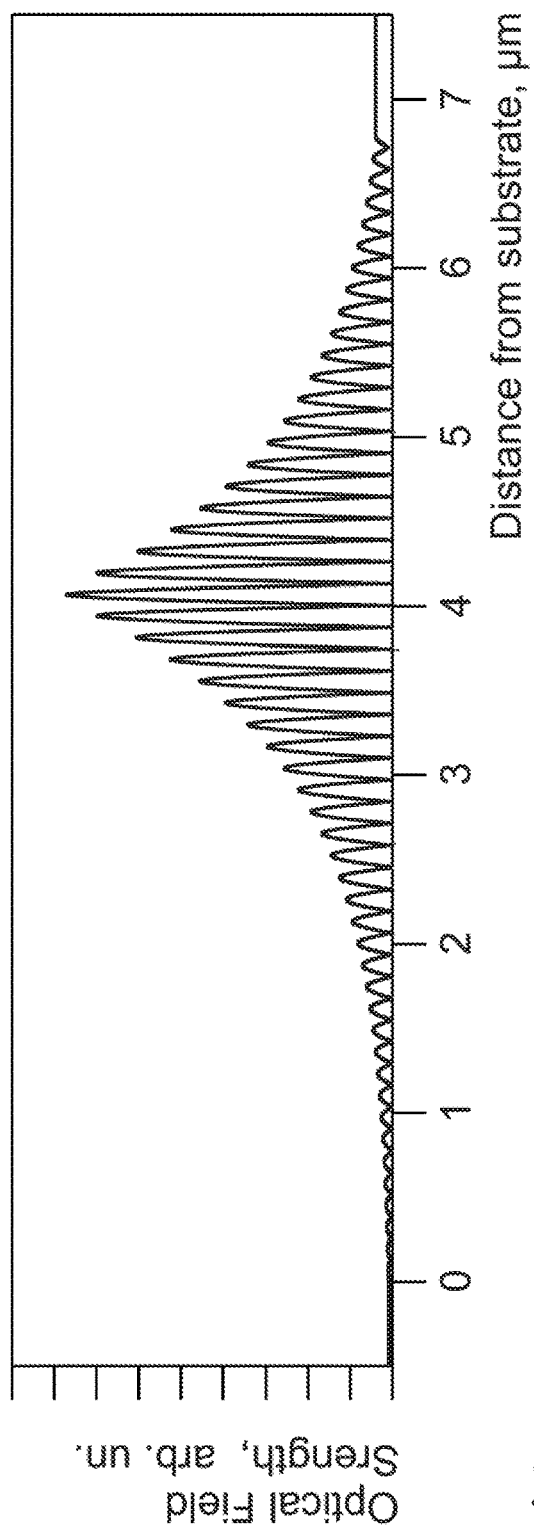
FIG. 1B. Optical field strength profile of the longitudinal optical mode in the prior art vertical-cavity surface emitting laser (VCSEL).
Figure 2A:
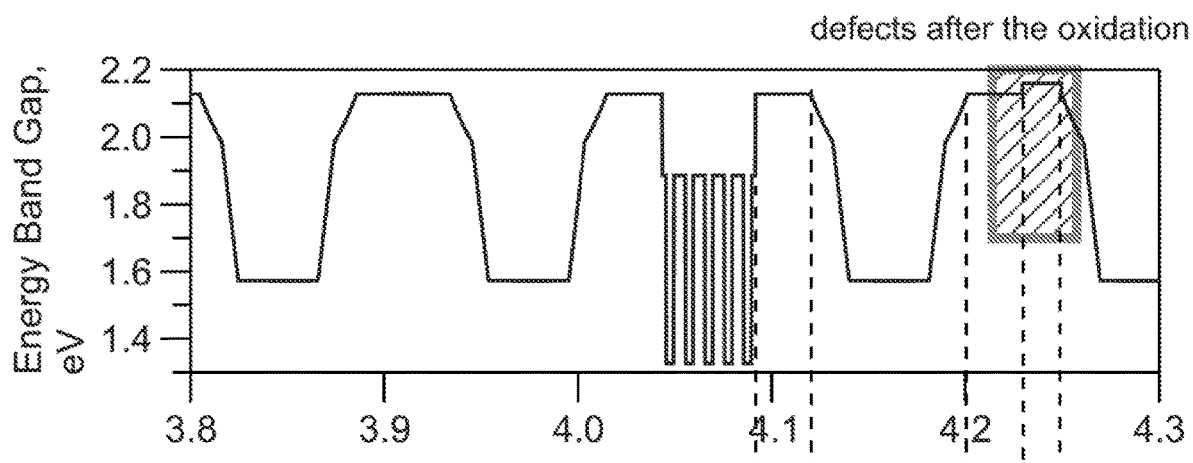
FIG. 2A. Energy band gap profile in the prior art vertical-cavity surface emitting laser (VCSEL) of FIG. 1A in the vicinity of the active medium.
Figure 2B:
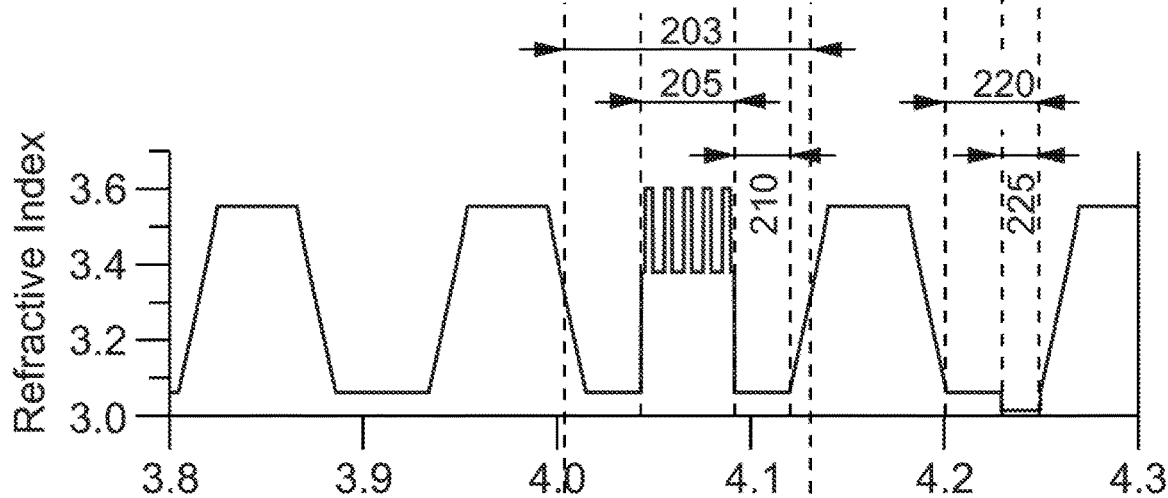
FIG. 2B. Vertical refractive index profile of the prior art vertical-cavity surface emitting laser (VCSEL) of FIG. 1A in the vicinity of the active medium, at a larger magnification.
Figure 2C:
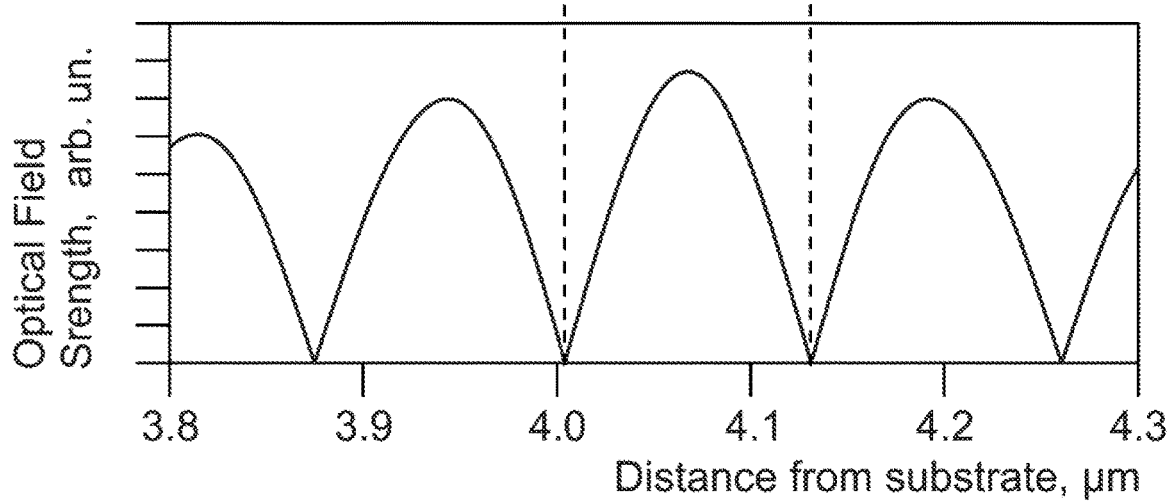
FIG. 2C. Optical field strength profile of the longitudinal optical mode in the prior art vertical-cavity surface emitting laser (VCSEL) of FIG. 1B in the vicinity of the active medium, at a larger magnification.
Figure 10:
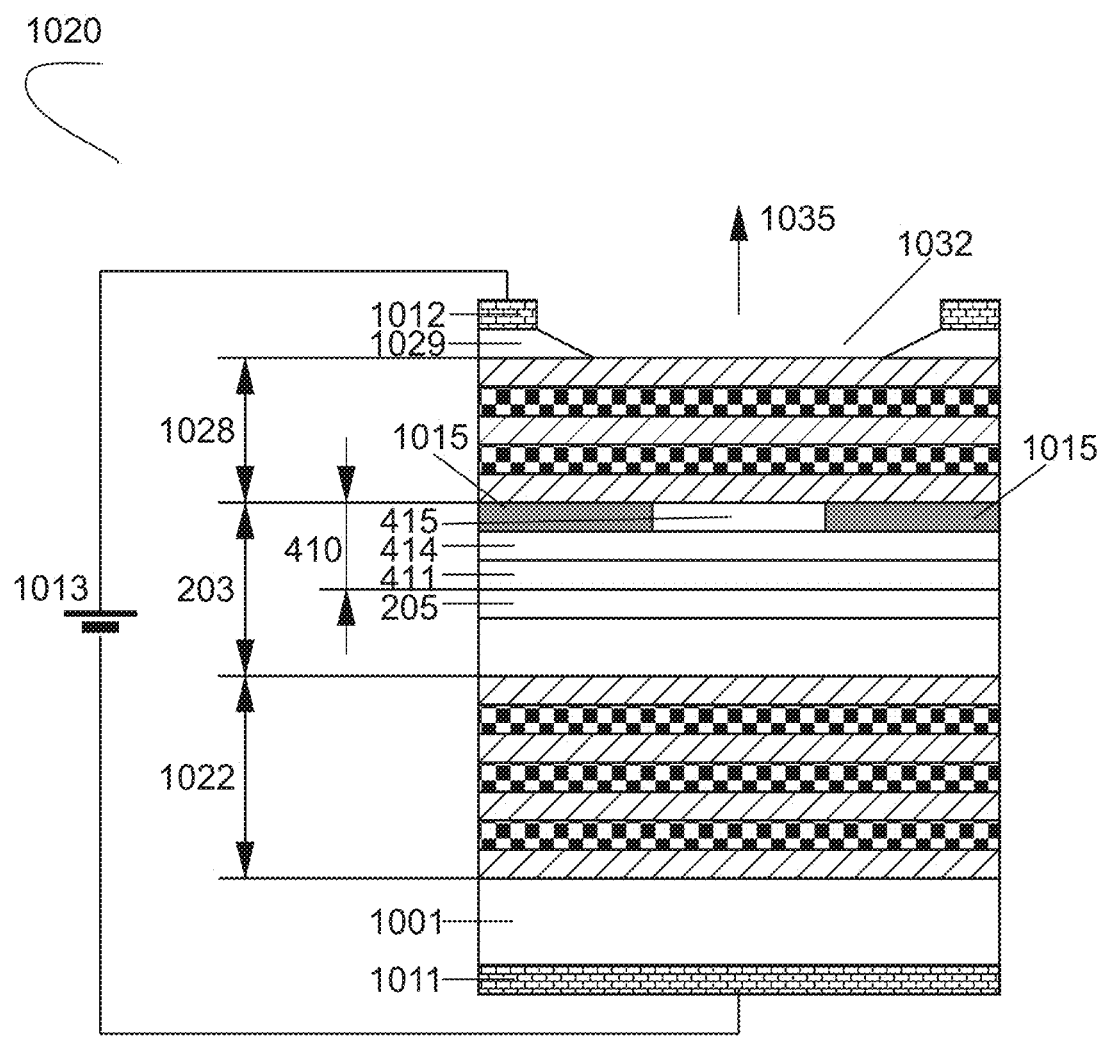
FIG. 10. Schematic structure of an injection VCSEL containing the key elements of the embodiments of FIGS. 3A, 4A, and 4B of the present invention.

FIG. 10 illustrates schematically a VCSEL containing the key element (410) of the embodiment of FIGS. 3A through 4C. The basic structure (1020) of the VCSEL reproduces that of FIG. 1B of the U.S. Pat. No. 7,339,965, wherein the 0.5λ-cavity (203) containing the broad band gap layer (410) of the top DBR which further contains a broad band gap emitter (411), a narrow band gap insertion (414), and a broad band gap oxide-confined aperture (415). The layer (415) is partly oxidized, and the layer of oxide (1015) is formed. The cavity (203) is located between an n-doped bottom DBR (1022) and a p-doped top DBR (1028). The structure is grown epitaxially on an n-doped substrate (1001). The bottom n-contact (1011) is mounted on the back side of the substrate (1001). The p-contact layer (1029) is preferably heavily doped and formed on top of the top DBR (1028). The top p-contact (1012) is mounted on top of the p-contact layer (1029).

The active medium (205) generates optical gain when a forward bias (1013) is applied. The active medium (205) then emits light which is bounced between the bottom DBR (1022) and the top DBR (1028). The DBRs have high reflectivity for light propagating in the direction normal to the p-n junction plane, and the reflectivity of the bottom DBR (1022) is preferably higher than that of the top DBR (1028). Thus, the VCSEL design provides a positive feedback for light propagating in the vertical direction and finally results in lasing. The laser light (1035) comes out through the optical aperture (1032).

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A vertical-cavity surface-emitting laser (VCSEL), comprising
    a) a resonant optical cavity having an effective lambda-half thickness;
        wherein said resonant optical cavity further comprises an active region;
    b) a first distributed Bragg reflector adjacent to said resonant optical cavity, further comprising
        at least one first aperture element, further comprising three sections, each being formed of a material selected from the group consisting of GaAs, alloy $Ga(1-x)Al(x)As$, and AlAs,
        said three sections being placed in the following sequence:
            A) a first section having a high aluminum content,
            B) a second section having a low aluminum content,
            C) a third section having a medium aluminum content,
            wherein
                AA) said high aluminum content of said first section is above 95%,
                BB) said low aluminum content of said second section is below 50%,
                CC) said medium aluminum content of said third section is lower than said high aluminum content of said first section by at least 5% and is higher than said low aluminum content of said second section,
        wherein said second section having a low aluminum content is placed in the middle of said three sections,
        wherein said first section forms upon oxidation an oxide-confined aperture,
        wherein despite oxidation of said first section vertical oxidation of both second and third section is suppressed,
        wherein said first element as a whole represents an effective quarter-lambda element of said first distributed Bragg reflector;
        wherein said second section and said third section of said at least one element are located in said resonant optical cavity, and
        wherein said oxide-confined aperture is located at a distance from said active region not exceeding lambda-quarter thickness.

2. The vertical-cavity surface-emitting laser of claim 1, further comprising
    (c) at least one second distributed Bragg reflector positioned adjacent to said resonant optical cavity at a side opposite to said at least one first distributed Bragg reflector.

3. The vertical-cavity surface-emitting laser of claim 2, wherein said resonant optical cavity and said first distributed Bragg reflector are formed from the materials selected from the group of materials consisting of
    i) GaAs,
    ii) AlAs,
    iii) alloy $Ga(1-x)Al(x)As$,
    wherein aluminum composition in said first section exceeds ninety-five percent.

4. The vertical-cavity surface-emitting laser of claim 3, wherein aluminum composition in said second section is below twenty percent.

5. The vertical-cavity surface-emitting laser of claim 2,
    wherein one of said first distributed Bragg reflector and said second distributed Bragg reflector is n-doped, forming an n-doped part of the VCSEL,
    wherein another one of said first distributed Bragg reflector and said second distributed Bragg reflector is p-doped, forming a p-doped part of the VCSEL,
    wherein a p-n junction is formed between said n-doped part of the VCSEL and said p-doped part of the VCSEL.

6. The vertical-cavity surface-emitting laser of claim 1,
    wherein oxidation of said third section and said second section from the mesa side is suppressed, and
    wherein oxidation of said second section in the vertical direction from the oxide layer formed upon oxidation of said first section is suppressed, and
    wherein said oxide-confined aperture has a well-defined thickness.

7. The vertical-cavity surface-emitting laser of claim 1,
    wherein said at least one second section is at least one narrow band gap insertion,
    wherein the energy band gap of said at least one narrow band gap insertion is smaller than the energy band gap of said third section,
    wherein the energy band gap of said narrow band gap insertion is smaller than the energy band gap of said semiconductor layer of said first section.

8. The vertical-cavity surface-emitting laser of claim 7,
    wherein said oxide-confined aperture is located from said active region at a distance not exceeding one half of the wavelength of the emitted laser light, wherein said wavelength is defined in the semiconductor material.

9. The vertical-cavity surface-emitting laser of claim 8, wherein said third section is a broad band gap cladding layer.

10. The vertical-cavity surface-emitting laser of claim 7, wherein said at least one narrow band gap insertion is several narrow band gap insertions.

11. The vertical-cavity surface-emitting laser of claim 9, wherein said at least one narrow band gap insertions is heavily p-doped, wherein heavily p-doped means p-doping to a level exceeding one times ten to the eighteen per cubic centimeter (1E18 cm-3).

12. The vertical-cavity surface-emitting laser of claim 1, wherein said vertical-cavity surface-emitting laser is an antiwaveguding vertical-cavity surface-emitting laser.

13. The vertical-cavity surface-emitting laser of claim 1, wherein said first section has a thickness that does not exceed one eighth of the wavelength of the emitted laser light in the semiconductor material.

14. The vertical-cavity surface-emitting laser of claim 1, wherein said active medium is formed of a structure selected from the group consisting of:
(a) a single quantum well,
(b) multiple quantum well,
(c) a single sheet of quantum wires,
(d) multiple sheets of quantum wires,
(e) a single sheet of quantum dots, or
(f) multiple sheets of quantum dots.

15. The vertical-cavity surface-emitting laser of claim 1, further comprising a means of current injection to said active medium.

16. The vertical-cavity surface-emitting laser of claim 1, further comprising a second aperture element located in a second broad band gap layer of said first distributed Bragg reflector.

* * * * *